United States Patent
Shimokawa et al.

(10) Patent No.: US 8,906,716 B2
(45) Date of Patent: *Dec. 9, 2014

(54) SEMICONDUCTOR DEVICE AND METHOD FOR MANUFACTURING THE SAME

(71) Applicant: Kabushiki Kaisha Toshiba, Minato-ku (JP)

(72) Inventors: Kazuo Shimokawa, Yokohama (JP); Takashi Koyanagawa, Yokohama (JP); Takeshi Miyagi, Fujisawa (JP); Akihiko Happoya, Kamakura (JP); Kazuhito Higuchi, Yokohama (JP); Tomoyuki Kitani, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/023,641

(22) Filed: Sep. 11, 2013

(65) Prior Publication Data

US 2014/0008688 A1 Jan. 9, 2014

Related U.S. Application Data

(62) Division of application No. 12/556,134, filed on Sep. 9, 2009, now Pat. No. 8,581,291.

(30) Foreign Application Priority Data

Dec. 8, 2008 (JP) .................................. 2008-312453

(51) Int. Cl.
*H01L 33/00* (2010.01)
*H01L 33/62* (2010.01)
*H01L 33/50* (2010.01)
*H01L 33/38* (2010.01)
*H01L 33/44* (2010.01)

(52) U.S. Cl.
CPC ............ *H01L 33/62* (2013.01); *H01L 33/0079* (2013.01); *H01L 33/505* (2013.01); *H01L 33/38* (2013.01); *H01L 33/44* (2013.01); *H01L 2924/0002* (2013.01)
USPC .......... 438/26; 257/99; 257/98; 257/E33.066; 257/E33.064

(58) Field of Classification Search
USPC ........................................................... 438/26
See application file for complete search history.

(56) References Cited

U.S. PATENT DOCUMENTS 6,331,450 B1 12/2001 Uemura
6,964,877 B2 11/2005 Chen et al.
(Continued)

FOREIGN PATENT DOCUMENTS

EP 2 113 949 A2 11/2009
JP 2-196477 8/1990
(Continued)

OTHER PUBLICATIONS

Office Action issued Aug. 8, 2010 in JP Application No. 2008-312453 (with English Translation).

(Continued)

*Primary Examiner* — Jerome Jackson, Jr.
(74) *Attorney, Agent, or Firm* — Oblon, Spivak, McClelland, Maier & Neustadt, L.L.P.

(57) ABSTRACT

Provided is an optical semiconductor device includes: a light-emitting layer having a first main surface, a second main surface opposed to the first main surface, a first electrode and a second electrode which are formed on the second main surface; a fluorescent layer provided on the first main surface; a light-transmissive layer provided on the fluorescent layer and made of a light-transmissive inorganic material; a first metal post provided on the first electrode; a second metal post provided on the second electrode; a sealing layer provided on the second main surface so as to seal in the first and second metal posts with one ends of the respective first and second metal posts exposed; a first metal layer provided on the exposed end of the first metal post; and a second metal layer provided on the exposed end of the second metal post.

38 Claims, 9 Drawing Sheets

(56) References Cited

U.S. PATENT DOCUMENTS

| | | | |
|---|---|---|---|
| 7,157,352 B2 * | 1/2007 | Yamanaka | 438/458 |
| 7,951,625 B2 | 5/2011 | Kamei | |
| 2006/0154389 A1 | 7/2006 | Doan | |
| 2006/0202223 A1 | 9/2006 | Sackrison et al. | |
| 2008/0061312 A1 | 3/2008 | Gao et al. | |
| 2008/0217639 A1 | 9/2008 | Kim et al. | |

FOREIGN PATENT DOCUMENTS

| | | |
|---|---|---|
| JP | 2000-183407 | 6/2000 |
| JP | 2001-177158 | 6/2001 |
| JP | 2003-7929 | 1/2003 |
| JP | 2006-12986 | 1/2006 |
| JP | 2006-41479 | 2/2006 |
| JP | 2007-19511 | 1/2007 |
| JP | 2007-34315 | 2/2007 |
| JP | 2007-88480 | 4/2007 |
| JP | 2007-158298 | 6/2007 |
| JP | 2007-324630 | 12/2007 |
| JP | 2007-329465 | 12/2007 |
| JP | 2008-252142 | 10/2008 |
| JP | 2009-60077 | 3/2009 |
| WO | WO 2008/050748 A1 | 6/2005 |
| WO | WO 2005/062905 A2 | 7/2005 |
| WO | WO 2008/062783 A1 | 5/2008 |
| WO | WO 2008-078299 A1 | 7/2008 |
| WO | WO 2008/102548 | 8/2008 |
| WO | WO 2008/115213 A2 | 9/2008 |

OTHER PUBLICATIONS

Office Action issued Dec. 7, 2010 in JP Application No. 2008-312453 (with English Translation).

Japanese Office Action issued May 19, 2011, in Patent Application No. 2008-312453 (with English translation).

European Search Report dated Aug. 28, 2014, issued in European Patent Application No. 14168448.0.

* cited by examiner

SEMICONDUCTOR DEVICE AND METHOD FOR MANUFACTURING THE SAME

CROSS REFERENCE OF THE RELATED APPLICATION

This application is a division of and claims the benefit of priority under 35 U.S.C. §120 from U.S. Ser. No. 12/556,134, filed Sep. 9, 2009, and claims the benefit of priority from Japanese Patent Application No. 2008-312453, filed on Dec. 8, 2008; the entire contents of which are incorporated herein by reference.

BACKGROUND OF THE INVENTION

1. Field of the Invention

The present invention relates to an optical semiconductor device and a method for manufacturing the same.

2. Description of the Related Art

In response to the development of a high-intensity optical semiconductor element that emits blue light, there has been commercialized an optical semiconductor device that emits white light by using an optical semiconductor element that emits blue light and a phosphor capable of wavelength conversion from blue light into yellow light. Such an optical semiconductor device that emits white light has characteristics of: being small in size; emitting high-intensity light relative to a supplied power amount; having a long life; and using no toxic substance such as mercury. These characteristics allow the optical semiconductor device to be increasingly used in various fields such as application to an under-button light source or a flash light source for portable phone and application to an interior light source and an exterior light source for vehicle.

In terms of total flux relative to a supplied power amount, an optical semiconductor device using blue LEDs currently has an efficiency of 150 lm/W, which is larger than those of conventional light sources such as an incandescent light bulb (15 lm/W to 20 lm/W) and a fluorescent lamp (60 lm/W to 90 lm/W). However, in terms of cost required for one lm, the optical semiconductor device has a problem of requiring cost more than ten times higher than the conventional light sources which require 0.1 yen/lm to 0.2 yen/lm. As a measure to reduce the cost, there has been studied a structure of an optical semiconductor device allowing cost reduction while enhancing the luminous efficiency of an element therein.

The most general optical semiconductor device that has been commercialized has a structure including: an optical semiconductor element that emits blue light; an Ag-plated Cu frame formed of a white thermoplastic resin by molding, and used as a wiring board; a connection material for connecting the optical semiconductor element and the frame; a gold wire through which a current flows between the frame and a top surface electrode of the optical semiconductor element; and a silicone resin mixed with phosphor particles for wavelength conversion from blue light into yellow light and sealing in the optical semiconductor element (see JP-A No. 2000-183407 (KOKAI), for example).

In manufacturing this optical semiconductor device, a white thermoplastic resin is firstly formed into the Ag-plated Cu frame by molding. Then, a connection resin is applied onto a portion, on which the optical semiconductor element is to be mounted, of the frame. Thereafter, the optical semiconductor element is mounted on the portion, and the connection resin is hardened by heating in an oven. Thereby, the optical semiconductor element is connected to the frame. Then, by using a wire bonder, the electrode formed on the chip top surface of the optical semiconductor element is connected to the frame with an Au wire. Thereafter, a silicone resin with a phosphor concentration adjusted to allow the optical semiconductor device to emit white light is applied, by a dispense technique, around the portion in which the optical semiconductor element is mounted, and then hardened by heating. Lastly, a product portion including the optical semiconductor element is cut off, and the frame used as an exterior electrode is finished by a forming process. Thereby, the optical semiconductor device is completed.

As described above, a conventional optical semiconductor device is manufactured by incorporating a blue light semiconductor element in a structure of an optical semiconductor device that, in most cases, has been commercialized using an optical semiconductor element that emits light having a wavelength of 500 nm or more. The optical semiconductor device that emits such long-wavelength light has a high directivity and has thus been applied to devices for vehicle, display panels, amusement machines and the like.

Such a conventional optical semiconductor device manufactured as above has a problem of having a shorter life for reasons, such as that blue light, which has a short wavelength and a high intensity, discolors a reflector resin having benzene ring. In addition, an optical semiconductor device that emits white light commercialized in response to the development of a high-intensity optical semiconductor element that emits blue light has been increasingly applied to lighting apparatuses as well as conventionally-applied apparatuses such as devices for vehicle and display panels. With this trend, cost reduction of the optical semiconductor device has been indispensably required. However, the conventional structure of an optical semiconductor device only allows limited cost reduction, and thus the structure and the manufacturing process of the optical semiconductor device has been required to be reconsidered.

In addition, when an optical semiconductor device is applied to a lighting apparatus, a light source therein cannot be formed of a single optical semiconductor device. Accordingly, in order to replace a general lighting apparatus, such as a fluorescent lamp, with an apparatus using an optical semiconductor device that emits white light, the apparatus needs to include multiple optical semiconductor devices. In this case, to eliminate defects such as nonuniform intensity in a light-emitting surface, a large number of small optical semiconductor devices need to be mounted on a wiring board. Accordingly, the size reduction of the optical semiconductor device has also been required.

SUMMARY OF THE INVENTION

An object of the present invention is to provide an optical semiconductor device that is capable of suppressing the life reduction thereof, that can be manufactured at reduced cost, and that can be miniaturized approximately to the size of an optical semiconductor element, and to provide a method for manufacturing such an optical semiconductor device.

A first aspect according to an embodiment of the present invention is an optical semiconductor device includes: a light-emitting layer having a first main surface, a second main surface opposed to the first main surface, a first electrode and a second electrode which are formed on the second main surface; a fluorescent layer containing phosphor particles and provided on the first main surface; a light-transmissive layer provided on the fluorescent layer and made of a light-transmissive inorganic material; a first metal post provided on the first electrode; a second metal post provided on the second electrode; a sealing layer provided on the second main surface so as to seal in the first and second metal posts with one ends of the respective first and second metal posts exposed; a first metal layer provided on the exposed end of the first metal post; and a second metal layer provided on the exposed end of the second metal post.

A second aspect according to an embodiment of the present invention is a method for manufacturing an optical semiconductor device, includes: manufacturing a light-emitting substrate by forming multiple groups of positive and negative electrodes on a first main surface of a light-emitting layer, the positive and negative electrodes being used to cause a current for exciting the light-emitting layer to flow through the light-emitting layer; manufacturing a fluorescent substrate by forming, on a light-transmissive inorganic film, a fluorescent layer made of a resin in which phosphor particles are dispersed; bonding the fluorescent layer of the fluorescent substrate onto a second main surface of the light-emitting layer which is opposed to the first main surface; and separating the bonded substrate into pieces each including one of the groups of the positive and negative electrodes.

A third aspect according to an embodiment of the present invention is a method for manufacturing an optical semiconductor device, includes: forming multiple light-emitting layers on a substrate, the light-emitting layers each having a first main surface, a second main surface opposed to the first main surface, a first electrode and a second electrode which are formed on the second main surface; forming a conductive film on the substrate, on which the multiple light-emitting layers are formed, so that the conductive film covers the multiple light-emitting layers; forming a sacrifice layer on the conductive film, the sacrifice layer having openings located respectively on the first and second electrodes of all of the light-emitting layers; forming plated layers respectively on the first and second electrodes of all of the light-emitting layers by electroplating using the conductive film as a negative electrode; removing the sacrifice layer and the conductive film from the substrate on which the plated layers are formed; forming a sealing layer on the substrate from which the sacrifice layer and the conductive film are removed, the sealing layer sealing in the plated layers of all of the light-emitting layers; exposing one ends of the respective plated layers of all of the light-emitting layers from the sealing layer; forming a fluorescent layer containing phosphor particles on a light-transmissive substrate made of a light-transmissive inorganic material; bonding the fluorescent layer formed on the light-transmissive substrate onto all of the light-emitting layers; forming metal layers respectively on the exposed ends of the plated layers of all of the light-emitting layers; and separating the resultant substrate into pieces each including one of the light-emitting layers.

A fourth aspect according to an embodiment of the present invention is a method for manufacturing an optical semiconductor device, includes: forming multiple light-emitting layers on a substrate, the light-emitting layers each having a first main surface, a second main surface opposed to the first main surface, a first electrode and a second electrode which are formed on the second main surface; forming a conductive film on the substrate, on which the multiple light-emitting layers are formed, so that the conductive film covers the multiple light-emitting layers; forming a sacrifice layer on the conductive film, the sacrifice layer having openings located respectively on the first and second electrodes of all of the light-emitting layers; forming plated layers respectively on the first and second electrodes of all of the light-emitting layers by electroplating using the conductive film as a negative electrode; removing the sacrifice layer and the conductive film from the substrate on which the plated layers are formed; forming a sealing layer on the substrate from which the sacrifice layer and the conductive film are removed, the sealing layer sealing in the plated layers of all of the light-emitting layers; exposing one ends of the respective plated layers of all of the light-emitting layers from the sealing layer; forming a fluorescent layer containing phosphor particles on all of the light-emitting layers; forming a light-transmissive layer made of a light-transmissive inorganic material on the fluorescent layer; forming metal layers respectively on the exposed ends of the plated layers of all of the light-emitting layers; and separating the resultant substrate into pieces each including one of the light-emitting layers.

DESCRIPTION OF THE PREFERRED EMBODIMENTS

First Embodiment

Figure 1:
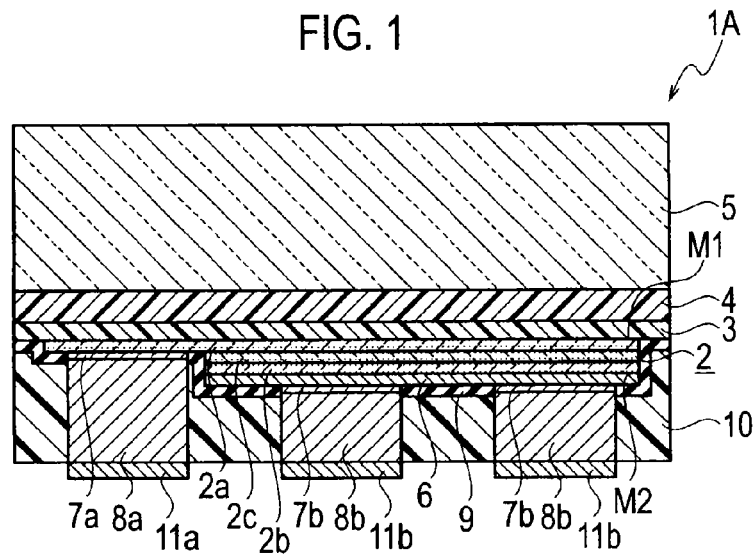
FIG. 1 is a cross-sectional view showing a schematic structure of an optical semiconductor device according to a first embodiment of the present invention.
Figure 2:
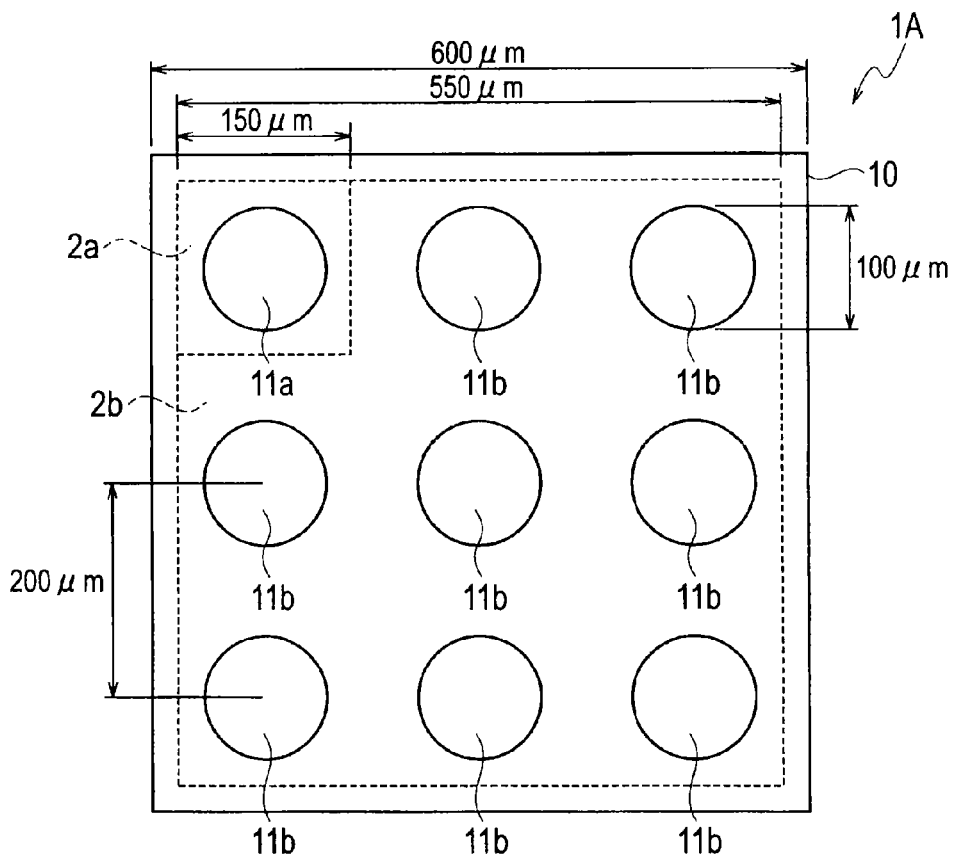
FIG. 2 is a plan view showing the lower surface of the optical semiconductor device shown in FIG. 1.

With reference to FIGS. 1 and 2, a first embodiment of the present invention will be described.

As shown in FIG. 1, an optical semiconductor device 1A according to the first embodiment of the present invention includes: a light-emitting layer 2, an adhesive layer 3, a fluorescent layer 4, a light-transmissive layer 5, a reflective layer 6, a first electrode 7a, multiple second electrodes 7b, a first metal post 8a, multiple second metal posts 8b, an insulating layer 9, a sealing layer 10, a first metal layer 11a and multiple second metal layers 11b. The light-emitting layer 2 has a first main surface M1 and a second main surface M2. The adhesive layer 3, the fluorescent layer 4 and the light-transmissive layer 5 are sequentially provided on the first main surface M1. The reflective layer 6 is provided on a first region of the second main surface M2 of the light-emitting layer 2. The first electrode 7a is provided on a second region of the second main surface M2. The second electrodes 7b are provided on the reflective layer 6. The first metal post 8a is provided on the first electrode 7a. The second metal posts 8b are provided on the respective second electrodes 7b. The insulating layer 9 is provided on regions, other than those with the metal posts 8a and 8b, of the second main surface M2 of the light-emitting layer 2. The sealing layer 10 is provided on the insulating layer 9 so as to seal in the metal posts 8a and 8b. The first metal layer 11a is provided on one end of the first metal post 8a. The second metal layers 11b are provided on one ends of the second metal posts 8b, respectively.

The light-emitting layer 2 is formed of first and second cladding layers 2a and 2b, and an active layer 2c. The first cladding layer 2a is an n-type semiconductor layer. The second cladding layer 2b is a p-type semiconductor layer, and is smaller in area than the first cladding layer 2a. The active layer 2c is held between the first and second cladding layers 2a and 2b. The light-emitting layer 2 has a thickness of 5 µm, and is formed, for example, of InGaN layers that emit blue light. Note that the upper surface (in FIG. 1) of the first cladding layer 2a serves as the first main surface M1, and the lower surface (in FIG. 1) of the second cladding layer 2b and part of the lower surface (in FIG. 1) of the first cladding layer 2a collectively serve as the second main surface M2, which has a step.

As shown in FIG. 2, the planar shape of the first cladding layer 2a is a square 550 µm on a side (see the dotted line of FIG. 2). On a region, not including a corner region (a square 150 µm on a side), of the lower surface (in FIG. 1) of the first cladding layer 2a, the second cladding layer 2b is formed with the active layer 2c interposed therebetween. The active layer 2c has the same shape and approximately the same area as the second cladding layer 2b.

The adhesive layer 3 is made of a silicone resin. The adhesive layer 3 has a thickness not more than 1 µm, for example, and bonds the fluorescent layer 4 and the first main surface M1 of the first cladding layer 2a of the light-emitting layer 2 together. Specifically, as the silicone resin, methyl phenyl silicone having a refractive index of approximately 1.5 is used. As a resin for sealing in phosphor particles, methyl phenyl silicone or a silicone resin different in composition, such as dimethyl silicone, may be used. Alternatively, as long as appropriate for the intended use, another resin may be used. For example, when the optical semiconductor device 1A has a low luminance and thus the sealing resin will not be degraded by blue light, a resin such as an epoxy resin, a hybrid resin of an epoxy resin and a silicone resin, or a urethane resin may be used as the sealing resin.

The fluorescent layer 4 is formed by mixing phosphor particles in a silicone resin. The phosphor particles convert blue light into long-wavelength light. The fluorescent layer 4 has a thickness of 15 µm, for example. As the silicone resin, methyl phenyl silicone having a refractive index of approximately 1.5, which is also used for the adhesive layer 3, is used. However, the silicone resin used for the fluorescent layer 4 is not limited to this, but may be another resin. Meanwhile, as the phosphor, used is YAG:Ce, which is yttrium aluminate doped with cerium as an activator and which has a particle diameter not more than 10 µm. Alternatively, as the phosphor, $(Sr, Ba)_2SiO_4$, which is strontium-barium silicate doped with europium as an activator, $Ca_p(Si, Al)_{12}$ or the like may be used according to need. Moreover, the mixed phosphor need not necessarily be made of a material having a single composition, but may be made of a mixture of two materials: one for wavelength conversion from blue light into green light; the other for wavelength conversion from blue light into red light.

The light-transmissive layer 5 is made of a transparent substrate made of a material such as optical glass or quartz. The light-transmissive layer 5 has a thickness of 200 µm, for example. The material of the light-transmissive layer 5 is not limited to the transparent substrate, but may be another light-transmissive material. In other words, the light-transmissive layer 5 needs only to be made of a light-transmissive substrate made of a light-transmissive inorganic material. However, in the interest of light extraction efficiency of the optical semiconductor device 1A, a substrate having as a low refractive index as possible within a range from 1.0 to 2.0 should preferably be used as the light-transmissive substrate. This reduces a difference in refractive index between the fluorescent layer 4 and the air, and thus can improve the light extraction efficiency of the optical semiconductor device 1A.

The reflective layer 6 is made of a metal such as Ag or Al, and has a thickness of 0.3 µm, for example. The reflective layer 6 is provided on the entire region (first region) of the lower surface (in FIG. 1) of the second cladding layer 2b in the light-emitting layer 2. Specifically, an Ni/Au contact electrode (not shown) is formed by depositing metals such as Ni and Au in a thickness of 0.1 µm/0.1 µm on the lower surface of the second cladding layer 2b, and the reflective layer 6 having a thickness of 0.3 µm is then formed thereon.

The first electrode 7a is formed by depositing metals such as Ni and Au in a thickness of 0.1 µm/0.1 µm, and thus has a thickness of 0.2 µm. The first electrode 7a, which is formed in a circle having a diameter of 100 µm, is provided on an exposed region (second region) of the lower surface (in FIG. 1) of the first cladding layer 2a in the light-emitting layer 2 (see FIG. 2).

Each second electrode 7b is also formed by depositing metals such as Ni and Au in a thickness of 0.1 µm/0.1 µm, and thus has a thickness of 0.2 µm. The second electrodes 7b, each of which is formed in a circle having a diameter of 100 µm, are provided on the lower surface (in FIG. 1) of the reflective layer 6 with a 200 µm pitch (see FIG. 2).

The first metal post 8a is formed of a metal such as Cu to have a columnar shape. The first metal post 8a has a height of approximately 103 µm and a diameter of 100 µm. A current flows between the first metal post 8a and the first electrode 7a. Note that the shapes of the first electrode 7a and the first metal post 8a may be changed according to need.

Each second metal post 8b is formed of a metal such as Cu to have a columnar shape. The second metal post 8b has a height of approximately 100 µm and a diameter of 100 µm. A current flows between the second metal post 8b and the corresponding second electrode 7b. Like the second electrodes 7b, the second metal posts 8b are provided with a 200 μm pitch (see FIG. 2). Note that the shapes of the second electrodes 7b and the second metal posts 8b may be changed according to need.

The insulating layer 9 is made of $SiO_2$, and functions as a passivation film (protective film). The insulating layer 9 has a thickness of 0.3 μm. The insulating layer 9 entirely covers the light-emitting layer 2 including the ends thereof, and thus prevents a current from flowing from the outside into the light-emitting layer 2 excluding the first and second electrodes 7a and 7b. This can prevent defects such as short circuit attributable to the phenomenon that mounting solder creeps up.

The sealing layer 10 is formed of a thermosetting resin, and has a thickness of approximately 100 μm like the metal posts 8a and 8b. The sealing layer 10 is provided on the entire surface of the insulating layer 9 so as to seal in the first and second metal posts 8a and 8b while leaving one ends thereof exposed. Accordingly, the circumferential surface of each of the first and second metal posts 8a and 8b is completely covered with the sealing layer 10.

Note that, though provided so as to entirely cover the light-emitting layer 2 including the ends thereof, the insulating layer 9 need not necessarily be provided in this manner. Alternatively, not the insulating layer 9 but the sealing layer 10 may be provided so as to entirely cover the light-emitting layer 2 including the ends thereof. In this case as well, a current is prevented from flowing from the outside into the light-emitting layer 2 excluding the first and second electrodes 7a and 7b. Accordingly, defects such as short circuit attributable to the phenomenon that mounting solder creeps up can be prevented.

Each of the first and second metal layers 11a and 11b is formed by depositing metals such as Ni and Au in a thickness of 0.1 μm/0.1 μm. The first metal layer 11a is provided on the end, that is, the exposed portion, of the first metal post 8a. Each second metal layer 11b is provided on the end, that is, the exposed portion, of the corresponding second metal post 8b. Note that the first metal layer 11a has the same circular planar shape as the first electrode 7a, and each second metal layer 11b has the same circular planar shape as each second electrode 7b (see FIG. 2).

In the optical semiconductor device 1A as described above, when voltages are applied to the first and second metal posts 8a and 8b, the resultant potential is supplied to the first cladding layer 2a through the first metal post 8a, and the resultant potential is supplied to the second cladding layer 2b through the second metal posts 8b. As a result, light beams are emitted from the active layer 2c held between the first and second cladding layers 2a and 2b. Some of the emitted light beams are transmitted through the light-transmissive layer 5, and emitted from the surface of the light-transmissive layer 5 without reflection. Some of the emitted light beams are reflected by the reflective layer 6, then transmitted through the light-transmissive layer 5, and emitted from the surface of the light-transmissive layer 5. Others are incident on the phosphor particles included in the fluorescent layer 4, so that the phosphor particles are excited to emit light beams. Some of the light beams emitted from the phosphor particles are also transmitted through the light-transmissive layer 5, and emitted from the surface of the light-transmissive layer 5. Others are also reflected by the reflective layer 6, then transmitted through the light-transmissive layer 5, and emitted from the surface of the light-transmissive layer 5. In this way, the blue light beams emitted from the light-emitting layer 2 and the (yellow, or red and green) light beams emitted from the phosphor particles that are excited by the blue light beams are mixed into white light, which is emitted from the surface of the light-transmissive layer 5.

With the above-described structure, the optical semiconductor device 1A is simplified in configuration, and miniaturized to have a plane area as small as that of the light-emitting layer 2. In addition, the structure eliminates the need for molding, a mounting step and a connecting step in manufacturing the optical semiconductor device 1A. Accordingly, the optical semiconductor device 1A can be manufactured by using normal semiconductor manufacturing equipment, and thus can be manufactured at reduced cost. Moreover, in the structure, the fluorescent layer 4 for wavelength conversion from blue light into long-wavelength light is formed on the light-emitting layer 2, and the reflective layer 6 is formed under the lower surface of the light-emitting layer 2 (in FIG. 1). Accordingly, by causing the light-emitting layer 2 to emit blue light only upward, white light can be emitted toward the top surface (in FIG. 1) of the optical semiconductor device 1A. In addition, the light-transmissive layer 5 formed on the fluorescent layer 4 reduces the refractive index difference between the fluorescent layer 4 and the air, which allows the optical semiconductor device 1A to have improved light extraction efficiency. Furthermore, the above-mentioned structure allows the optical semiconductor device 1A, which has a plane area as small as that of the light-emitting layer 2, to be reliably mounted on a glass epoxy board, which is a typical wiring board. This is because the metal posts 8a and 8b reduce the linear expansion coefficient difference between the light-emitting layer 2 and the glass epoxy board.

As described above, according to the first embodiment of the present invention, the optical semiconductor device 1A having the above-described structure is obtained as follows. Firstly, the fluorescent layer 4 is provided on the light-emitting layer 2, and a light-transmissive inorganic material is then deposited on the fluorescent layer 4 so as to serve as the light-transmissive layer 5. Thereafter, the first metal post 8a is provided on the first electrode 7a of the light-emitting layer 2, and the second metal posts 8b are provided on the respective second electrodes 7b of the light-emitting layer 2. Then, the sealing layer 10 is provided on the light-emitting layer 2 so as to seal in the first and second metal posts 8a and 8b. In this optical semiconductor device 1A, the light-transmissive layer 5 is made of an inorganic material, and thus prevented from being degraded by light (blue light, in particular) emitted from the light-emitting layer 2. Accordingly, the life reduction of the optical semiconductor device 1A is suppressed. In addition, having a simplified structure, the optical semiconductor device 1A may be manufactured at reduced cost. Accordingly, cost reduction of the optical semiconductor device 1A can be achieved. Moreover, having a simplified structure and a plane area as small as that of the light-emitting layer 2, the optical semiconductor device 1A can be miniaturized approximately to the size of a typical optical semiconductor element.

Second Embodiment

Figure 3:
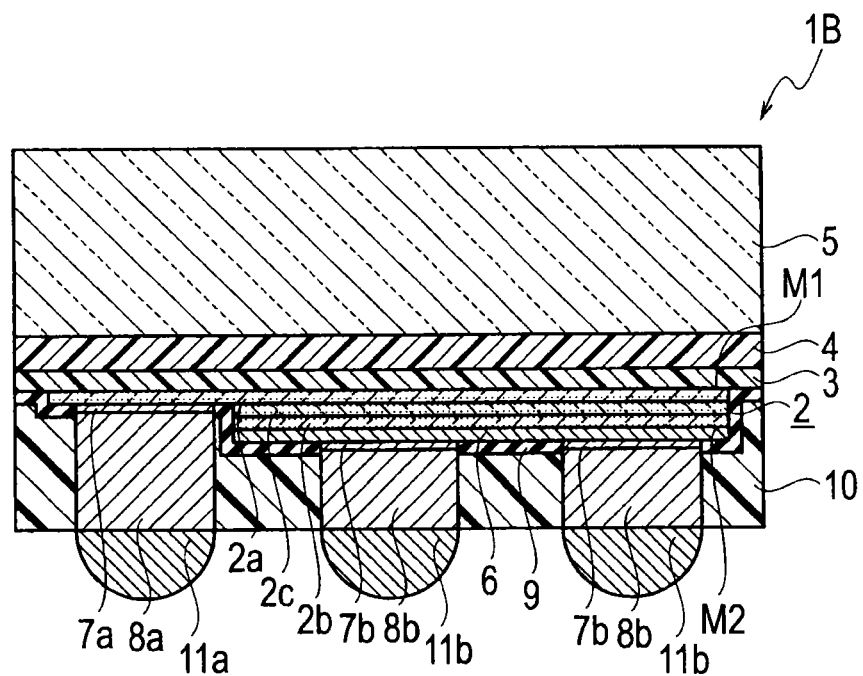
FIG. 3 is a cross-sectional view showing a schematic structure of an optical semiconductor device according to a second embodiment of the present invention.

With reference to FIG. 3, a second embodiment of the present invention will be described. In the second embodiment of the present invention, only differences from the first embodiment will be described. Note that, in the second embodiment, the same parts as those in the first embodiment are denoted by the same reference numerals, and the description thereof is omitted.

As shown in FIG. 3, in an optical semiconductor device 1B according to the second embodiment of the present invention, the first metal layer 11a and the second metal layers 11b are solder bumps. In other words, a hemispherical solder bump having a diameter of 100 μm, is formed on each of the first and second metal posts 8a and 8b. The solder bump is made of a solder material used for surface mounting, such as Sn-3.0Ag-0.5Cu, Sn-0.8Cu and Sn-3.5Ag.

As described above, the second embodiment of the present invention can provide the same effects as the first embodiment. Moreover, since the first metal layer 11a and the second metal layers 11b are formed of solder bumps, the optical semiconductor device 1B has a larger gap from a wiring board on which the optical semiconductor device 1B is mounted than the optical semiconductor device 1A according to the first embodiment. Accordingly, when the optical semiconductor device 1B is mounted on the wiring board, a stress attributable to the linear expansion coefficient difference between the optical semiconductor device 1B and the wiring board can be further reduced.

Third Embodiment

Figure 4:
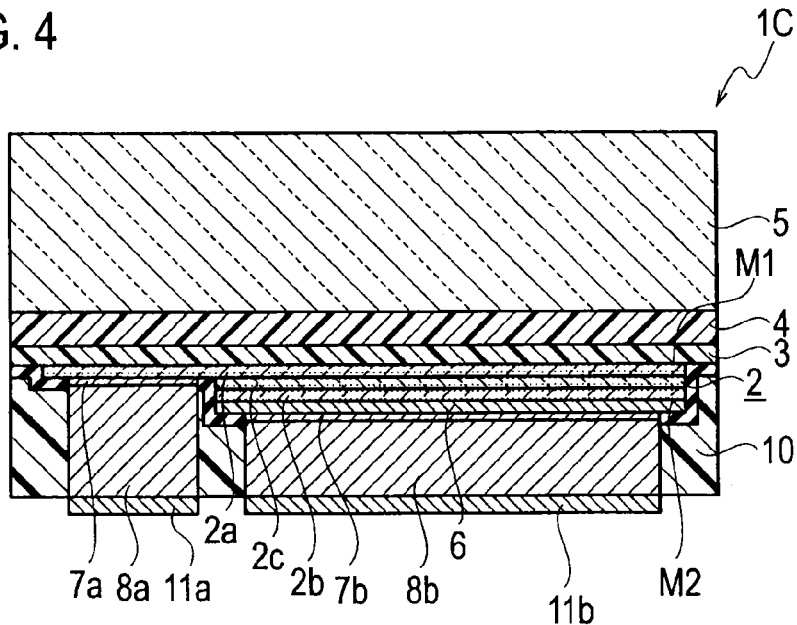
FIG. 4 is a cross-sectional view showing a schematic structure of an optical semiconductor device according to a third embodiment of the present invention.
Figure 5:
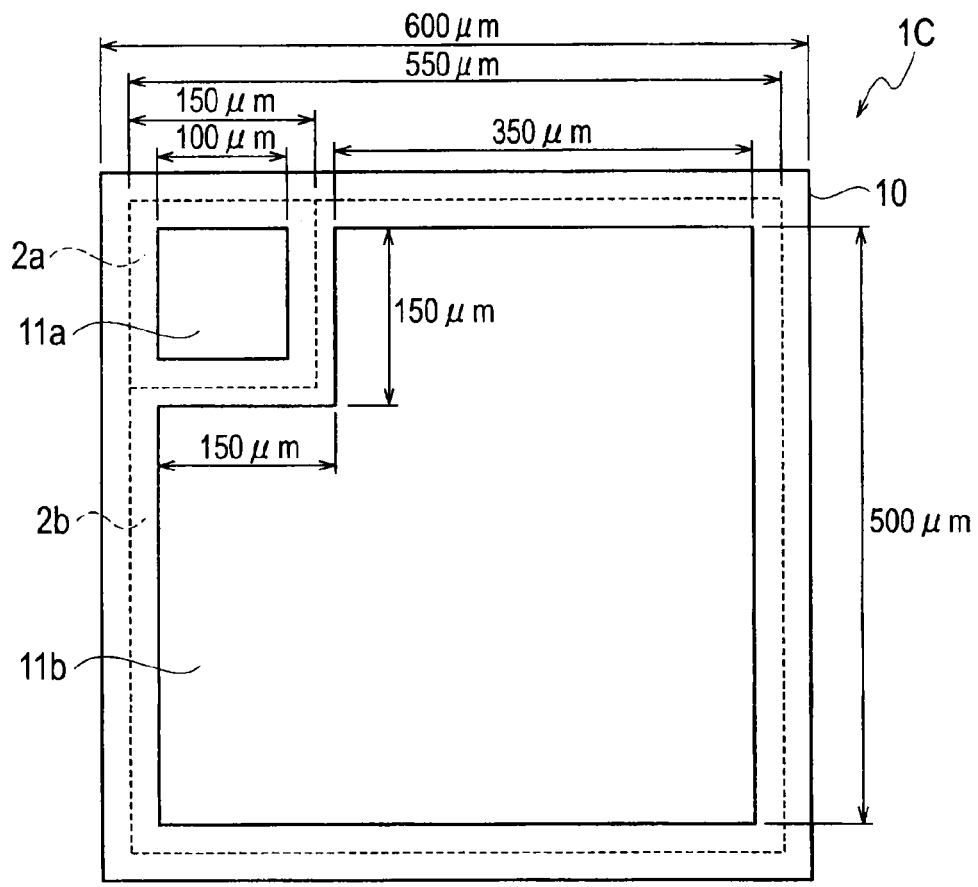
FIG. 5 is a plan view showing the lower surface of the optical semiconductor device shown in FIG. 4.

With reference to FIGS. 4 and 5, a third embodiment of the present invention will be described. In the third embodiment of the present invention, only differences from the first embodiment will be described. Note that, in the third embodiment, the same parts as those in the first embodiment are denoted by the same reference numerals, and the description thereof is omitted.

As shown in FIGS. 4 and 5, in an optical semiconductor device 1C according to the third embodiment of the present invention, the first electrode 7a is formed as a square 100 μm on a side on the lower surface (in FIG. 4) of the first cladding layer 2a. Meanwhile, on the lower surface (in FIG. 4) of the second cladding layer 2b, the second electrode 7b is formed as a square 500 μm on a side with a square 150 μm on a side cut out. Specifically, the cutout portion corresponds to the corner region of the first cladding layer 2a. The first metal post 8a is a rectangular column having the same planar shape as the first electrode 7a, while the second metal post 8b is a rectangular column having the same planar shape as the second electrode 7b. Moreover, the first metal layer 11a has the same planar shape as the first electrode 7a, the second metal layer 11b has the same planar shape as the second electrode 7b (see FIG. 5).

As described above, the third embodiment of the present invention can provide the same effects as the first embodiment. Moreover, in the optical semiconductor device 1C according to the third embodiment, the plane area of each of the first and second electrodes 7a and 7b is increased, and thus the plane area of each of the first and second metal posts 8a and 8b is increased, compared to the optical semiconductor device 1A according to the first embodiment. This expands heat dissipation paths for allowing heat generated during light emission to escape from the optical semiconductor device 1C, and thus reduces thermal resistance thereof. This allows the optical semiconductor device 1C to generate a reduced amount of heat during the passage of a current, and to have a greatly reduced transient thermal resistance.

Fourth Embodiment

Figure 6:
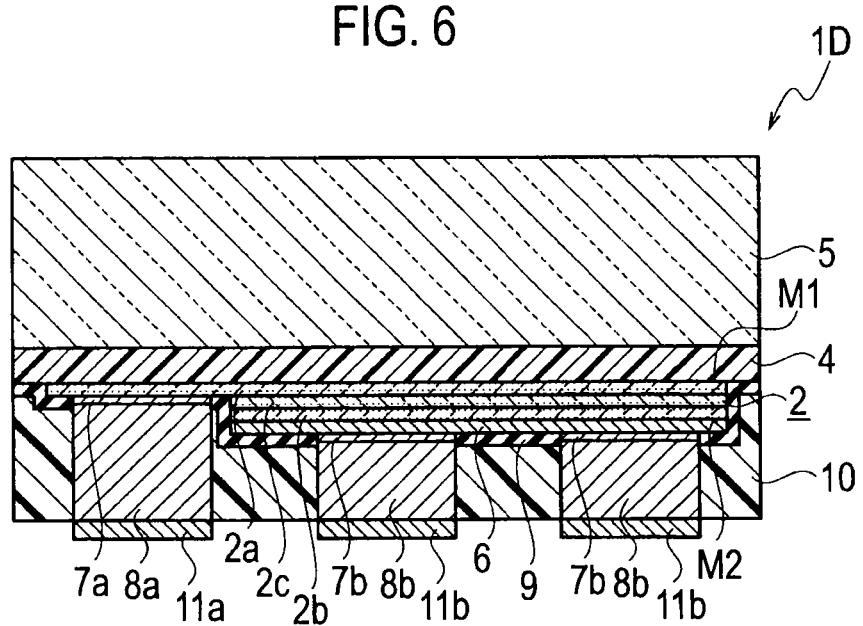
FIG. 6 is a cross-sectional view showing a schematic structure of an optical semiconductor device according to a fourth embodiment of the present invention.

With reference to FIG. 6, a fourth embodiment of the present invention will be described. In the fourth embodiment of the present invention, only differences from the first embodiment will be described. Note that, in the fourth embodiment, the same parts as those in the first embodiment are denoted by the same reference numerals, and the description thereof is omitted.

As shown in FIG. 6, an optical semiconductor device 1D according to the fourth embodiment of the present invention does not include the adhesive layer 3, and the fluorescent layer 4 is formed directly on the first main surface M1 of the light-emitting layer 2. The fluorescent layer 4 has a thickness of 10 μm, and is formed on the first main surface M1 of the light-emitting layer 2 by a method such as sputtering or chemical vapor deposition (CVD). The light-transmissive layer 5 is formed on the fluorescent layer 4 by, for example, applying a liquid glass onto the fluorescent layer 4 by spin coating, and then hardening the liquid glass.

As described above, the fourth embodiment of the present invention can provide the same effects as the first embodiment. Moreover, the above-described structure can eliminate, from the manufacturing process, a step of blending phosphor particles with a silicone resin and a step of bonding the fluorescent layer 4 onto the light-emitting layer 2, both of which are needed in the manufacturing process of the optical semiconductor device 1A according to the first embodiment. Thus, the fourth embodiment can reduce the manufacturing process time and the cost.

Fifth Embodiment

Figure 7:
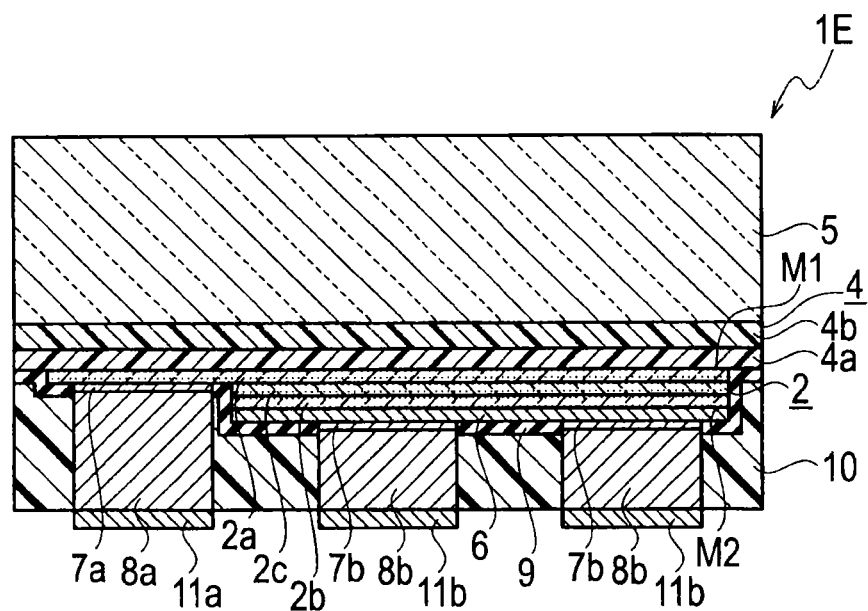
FIG. 7 is a cross-sectional view showing a schematic structure of an optical semiconductor device according to a fifth embodiment of the present invention.

With reference to FIG. 7, a fifth embodiment of the present invention will be described. In the fifth embodiment of the present invention, only differences from the first embodiment will be described. Note that, in the fifth embodiment, the same parts as those in the first embodiment are denoted by the same reference numerals, and the description thereof is omitted.

As shown in FIG. 7, an optical semiconductor device 1E according to the fifth embodiment of the present invention does not include the adhesive layer 3, and the fluorescent layer 4 is formed directly on the first main surface M1 of the light-emitting layer 2. In this embodiment, the fluorescent layer 4 consists of two layers, namely, fluorescent layers 4a and 4b respectively made of materials mutually different in composition. Specifically, on the light-emitting layer 2, sequentially formed are the fluorescent layer 4a for wavelength conversion from blue light into green light, and the fluorescent layer 4b for wavelength conversion from blue light into red light. Each of the fluorescent layers 4a and 4b has a thickness of 10 μm, and is formed on the first main surface M1 of the light-emitting layer 2 by a method such as sputtering or chemical vapor deposition (CVD). The light-transmissive layer 5 is formed on the fluorescent layer 4 by, for example, applying a liquid glass onto the fluorescent layer 4b by spin coating, and then hardening the liquid glass.

As described above, the fifth embodiment of the present invention can provide the same effects as the first embodiment. Moreover, the above-described structure can eliminate, from the manufacturing process, a step of blending phosphor particles with a silicone resin and a step of bonding the fluorescent layer 4 onto the light-emitting layer 2, both of which are needed in the manufacturing process of the optical semiconductor device 1A according to the first embodiment. Thus, the fifth embodiment can reduce the manufacturing process time and the cost.

Sixth Embodiment

With reference to FIGS. 8 to 19, a sixth embodiment of the present invention will be described. In the sixth embodiment of the present invention, a method for manufacturing the optical semiconductor device 1A according to the first embodiment will be described. Note that this manufacturing method can be used as a method for manufacturing the optical semiconductor device 1C according to the third embodiment. In the sixth embodiment, the same parts as those in the first embodiment are denoted by the same reference numerals, and the description thereof is omitted.

Figure 8:
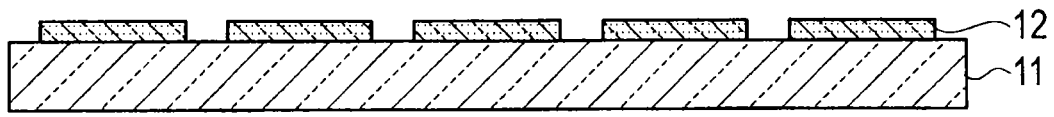
FIG. 8 is a first process cross-sectional view for illustrating a manufacturing method according to a sixth embodiment of the present invention.

Firstly, as shown in FIG. 8, InGaN light-emitting layers 12 that emit blue light are formed on a substrate 11, which is a sapphire wafer having a diameter of two inches and a thickness of 200 µm. Specifically, a light-emitting layer is formed by epitaxial growth, and then separated into the light-emitting layers 12 by reactive ion etching (RIE). In this way, the light-emitting layer 2 of the optical semiconductor device 1A is formed. The light-emitting layer 2 is formed by forming the first cladding layer 2a on a square region 550 µm on a side, and then forming the second cladding layer 2b on a region, not including a corner region (a square 150 µm on a side), of the lower surface of the first cladding layer 2a with the active layer 2c interposed therebetween (see FIGS. 1 and 2).

Figure 9:
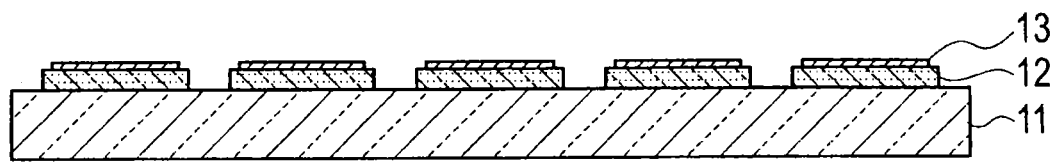
FIG. 9 is a second process cross-sectional view.

Then, as shown in FIG. 9, multi-layer films 13 are formed on the respective light-emitting layers 12 on the substrate 11. Specifically, Ni/Au films (not shown) having a thickness of 0.1 µm/0.1 µm are firstly formed on the entire surfaces of the light-emitting layers 12 by sputtering so as to serve as contact layers of the light-emitting layers 12, respectively. Then, metal films (not shown) made of Ag or Al and having a thickness of 0.3 µm are formed on the respective Ni/Au films by sputtering. In this way, the reflective layer 6 of the optical semiconductor device 1A is formed. Thereafter, Ni/Au films (not shown) having a thickness of 0.1 µm/0.1 µm, which are to be formed into electrodes, are respectively formed on electrode portions of the light-emitting layers 12. Then, $SiO_2$ passivation films (not shown) having a thickness of 0.3 µm are formed by sputtering on regions other than the electrode portions of the light-emitting layers 12. In this way, the first electrode 7a, the second electrodes 7b and the insulating layer 9 of the optical semiconductor device 1A are formed. As described above, the multi-layer films 13 are formed on the respective light-emitting layers 12 on the substrate 11.

Figure 10:
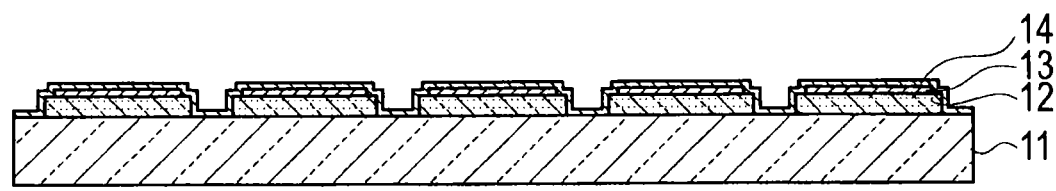
FIG. 10 is a third process cross-sectional view.

Then, as shown in FIG. 10, a seed layer 14, which is a conductive film serving as a power feeding layer for plating, is formed on the entire surface of the substrate 11 by a physical deposition method such as vapor deposition or sputtering. As this seed layer 14, a multi-layer film such as a Ti/Cu film is used. When the Ti/Cu film is employed, the Ti layer, which is formed to increase adhesion strength between the seed layer 14 and a resist or pads, needs only to have a thickness as small as 0.1 µm. Meanwhile, the Cu layer, which mainly contributes to power feeding, should preferably have a thickness not smaller than 0.2 µm.

Figure 11:
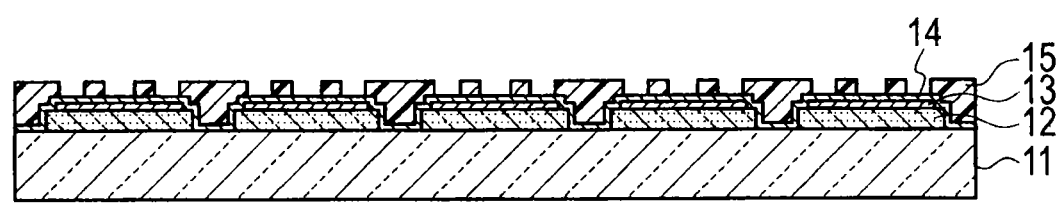
FIG. 11 is a fourth process cross-sectional view.

Thereafter, as shown in FIG. 11, a resist layer 15 serving as a sacrifice layer is formed on the entire surface of the substrate 11. The resist layer 15 has openings at electrode pad portions which are to be formed into the first and second electrodes 7a and 7b. As the resist, a photosensitive liquid resist or a dry film resist may be used. Specifically, the resist layer 15 is formed on the entire surface of the substrate 11 by forming a resist layer on the substrate 11, and then forming the openings in this resist layer by exposure and development using a light shield mask. After development, the resist may be baked depending on its material.

Figure 12:
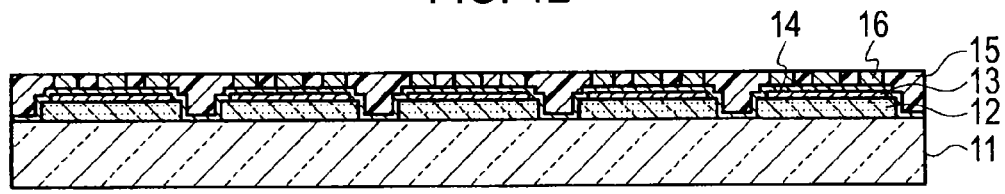
FIG. 12 is a fifth process cross-sectional view.

Then, as shown in FIG. 12, plated layers 16 are formed by electroplating in the respective openings of the resist layer 15. In this way, the metal posts 8a and 8b of the optical semiconductor device 1A are formed. In electroplating, the substrate 11, which is a wafer, is immersed in a plating liquid consisting of materials such as copper sulphate and sulphuric acid. Under this condition, current is caused to flow through the substrate 11 by connecting the seed layer 14 to the negative terminal of a direct-current power source, and connecting a Cu plate, serving as an anode, to the positive terminal of the direct-current power source, and thus Cu plating starts. Here, the Cu plate is placed so as to face the to-be-plated surface of the substrate 11. Before the thickness of the plated layer, which increases with time, reaches that of the resist layer 15, the current is stopped, and thus the plating is completed.

Figure 13:
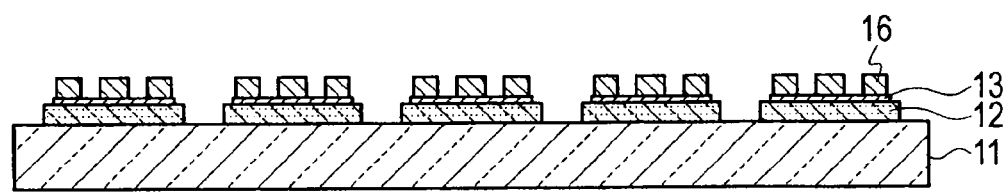
FIG. 13 is a sixth process cross-sectional view.

After the plating, as shown in FIG. 13, the resist layer 15 is peeled off the substrate 11, and then the seed layer 14 is etch removed by acid cleaning. Thereby, the light-emitting layers 12, the multi-layer films 13 and the plated layers 16 are exposed.

Figure 14:
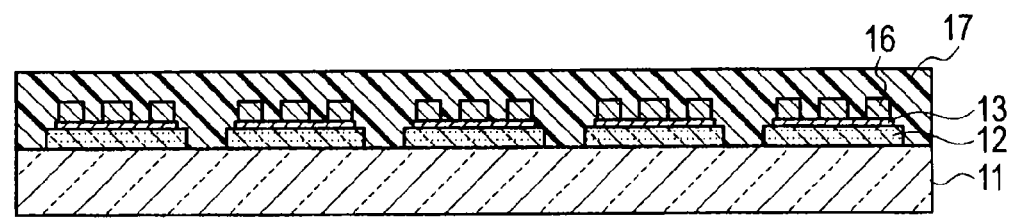
FIG. 14 is a seventh process cross-sectional view.

Then, as shown in FIG. 14, a thermosetting resin layer 17 to serve as a sealing layer is formed on the entire surface of the substrate 11. Specifically, a thermosetting resin is applied by spin coating around the plated layers 16 in a thickness to allow the plated layers 16 embedded therein. Thereafter, the resultant substrate 11 is put in an oven and heated, and thus the thermosetting resin layer 17 is hardened. The resin can be hardened by being heated at 150° C. for two hours, for example.

Figure 15:
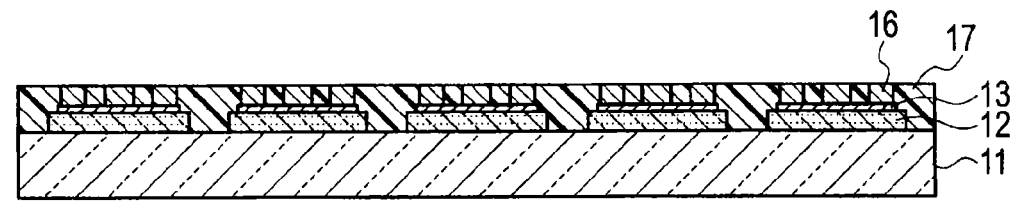
FIG. 15 is an eighth process cross-sectional view.

After that, as shown in FIG. 15, the surface of the thermosetting resin layer 17 is ground off so that ends of the respective plated layers 16 can be exposed. In this way, the sealing layer 10 of the optical semiconductor device 1A is formed. The thermosetting resin layer 17 is grounded by rotational grinding using a rotational grinding wheel, and thus the surface thereof can be planarized after being ground. After ground, the substrate 11 may be dried according to need. Note that, in the previous step, it is difficult to apply a thermosetting resin by a method such as spin coating with only the ends of the plated layers 16 exposed (It requires much time and cost). Accordingly, this grinding step is necessary for exposing the ends of the plated layers 16 after the spin coating step.

Figure 16:
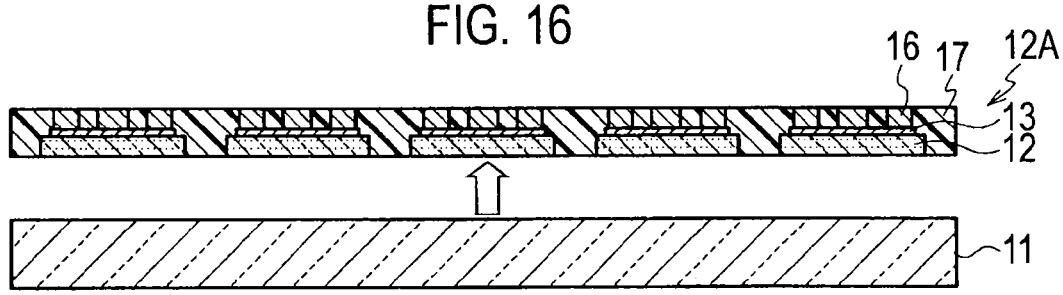
FIG. 16 is a ninth process cross-sectional view.

Then, as shown in FIG. 16, the light-emitting layers are lifted off the substrate 11 by irradiating the interface between the substrate 11 and the light-emitting layers 12 with laser beams. Thereby, a light-emitting substrate 12A formed of the light-emitting layers 12, the multi-layer films 13, the plated layers 16 and the thermosetting resin layer 17 is separated off the substrate 11. The light-emitting layers 12 are lifted off the substrate 11 by causing an Nd:YAG third harmonic laser to irradiate the interface therebetween with laser beams having a wavelength of 355 nm through the substrate 11. Note that the liftoff step is optional, and thus may be omitted.

Figure 17:
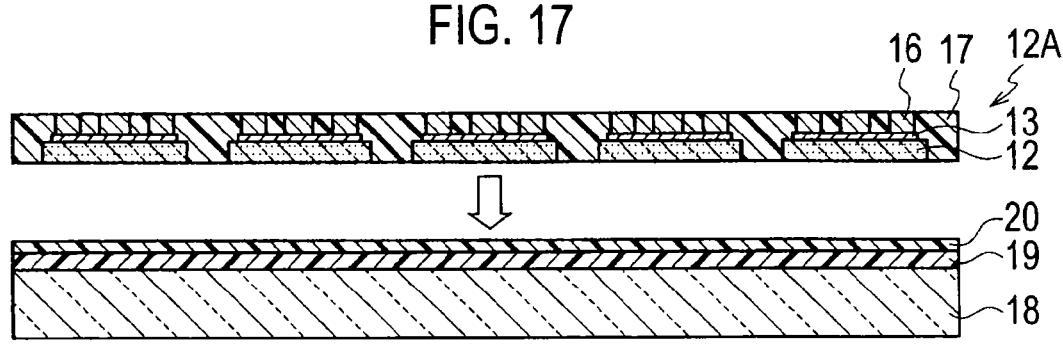
FIG. 17 is a tenth process cross-sectional view.

Then, as shown in FIG. 17, the surface, at which the light-emitting layers 12 are exposed, of the light-emitting substrate 12A formed by this liftoff step is bonded onto a fluorescent layer 19 that is provided on a light-transmissive substrate 18, such as an optical glass wafer with an adhesive layer 20 interposed therebetween. This fluorescent substrate on which the light-emitting substrate 12A is bonded is formed in another step. Specifically, a silicone resin layer mixed with phosphor particles is formed as the fluorescent layer 19 on the light-transmissive substrate 18 made of a light-transmissive inorganic material, and another silicone resin layer is formed as the adhesive layer 20 on the silicone resin layer. In this way, the light-transmissive layer 5, the fluorescent layer 4 and the adhesive layer 3 of the optical semiconductor device 1A are formed.

Here, the phosphor particles and the silicone resin are uniformly mixed using a rotary and revolutionary mixer, and then applied onto the light-transmissive substrate 18 by spin coating. The resultant light-transmissive substrate 18 is put in an oven, and the silicone resin is hardened therein. The silicone resin used here can be hardened by being heated at 150° C. for an hour, for example. In order to form the fluorescent layer 4 in a uniform thickness, after applied onto the light-transmissive substrate 18, the silicone resin is hardened with spacers formed thereon, and with jigs having anti-sticking surfaces coated with fluorine attached thereon. Thereby, the curvature of the surface of the silicone resin film attributable to surface tension can be suppressed, and thus the silicone resin film having a uniform thickness can be formed.

The light-emitting layers 12 are bonded onto the fluorescent layer 19, which is a silicone resin layer mixed with phosphor particles, as follows. Firstly, a silicone resin is applied onto the fluorescent layer 19 (or the light-emitting layers 12) by spraying. After that, the light-emitting substrate 12A appropriately positioned and stacked on the light-transmissive substrate 18. The light-emitting substrate 12A and the light-transmissive substrate 18 thus stacked are put into an oven, and bonded together by hardening the silicone resin therein. The silicone resin can be hardened by being heated at 150° C. for an hour, for example.

Figure 18:
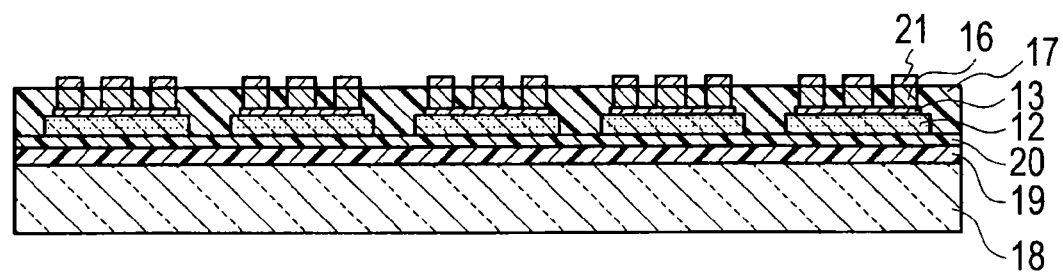
FIG. 18 is an eleventh process cross-sectional view.

Then, as shown in FIG. 18, Ni/Au layers 21 are formed by electroless plating on the respective plated layers 16 to serve as Cu electrodes. In this way, the metal layers 11a and 11b of the optical semiconductor device 1A are formed. In Ni electroless plating, the wafer is firstly degreased by, for example, being treated with a slightly alkaline degreasing liquid for three minutes, and is then washed with running water for one minute. Thereafter, the wafer is acid cleaned, and then immersed in a nickel-phosphorus plating liquid at liquid temperature adjusted to 70° C. Thereafter, the wafer is washed with water, and thus the Ni layers are formed. In addition, in Au electroless plating, the wafer is immersed in an electroless gold plating liquid at liquid temperature adjusted to 70° C. Thereafter, the wafer is washed with water and then dried. In this way, the surfaces of the respective Cu electrodes are plated.

Figure 19:
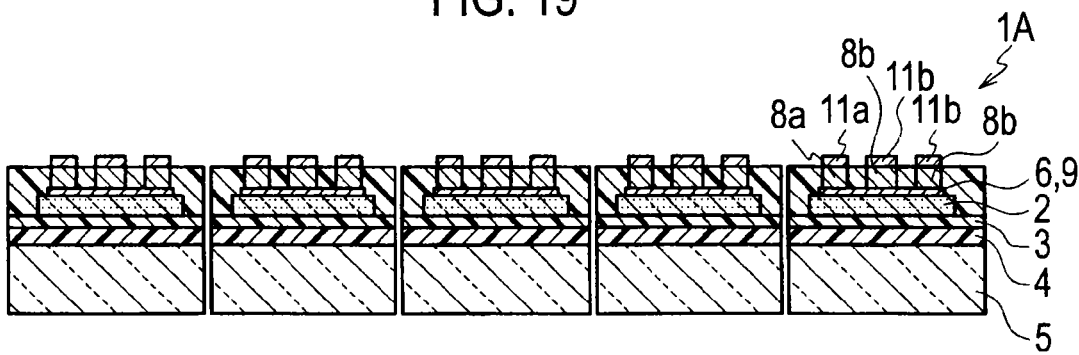
FIG. 19 is a twelfth process step cross-sectional view

Lastly, as shown in FIG. 19, the resultant stack is diced into the multiple optical semiconductor devices 1A using a dicer. In this way, the optical semiconductor device 1A according to the first embodiment is obtained. Note that approximately the same steps as above are employed in the manufacturing process of the optical semiconductor device 1C according to the third embodiment. By changing the size and shape of the openings in the resist layer 15, the optical semiconductor device 1C according to the third embodiment can be obtained.

As described above, according to the sixth embodiment of the present invention, the optical semiconductor device 1A according to the first embodiment can be manufactured. Thus, the sixth embodiment can provide the same effects as the first embodiment. In addition, by changing the size and shape of the openings in the resist layer 15, the optical semiconductor device 1C according to the third embodiment can be manufactured. Thus, the sixth embodiment can provide the same effects as the third embodiment. Moreover, the sixth embodiment allows a large number of optical semiconductor devices 1A or 1C to be manufactured through a single manufacturing process, and thus allows mass production of the optical semiconductor devices 1A or 1C. Therefore, the sixth embodiment can suppress the costs of the optical semiconductor devices 1A and 1C.

Seventh Embodiment

With reference to FIGS. 20 to 23, a seventh embodiment of the present invention will be described. In the seventh embodiment of the present invention, a method for manufacturing the optical semiconductor device 1B according to the second embodiment will be described. Note that, in the seventh embodiment, the same parts as those in the second embodiment are denoted by the same reference numerals, and the description thereof is omitted.

The manufacturing process according to the seventh embodiment of the present invention has the same steps as those in the sixth embodiment from the step of forming the light-emitting layers 12 shown in FIG. 8 to the bonding step shown in FIG. 17.

Figure 20:
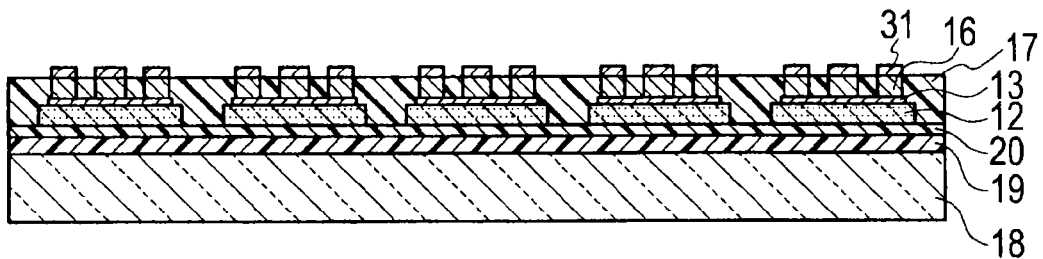
FIG. 20 is a first process cross-sectional view for illustrating a manufacturing method according to a seventh embodiment of the present invention.

After the bonding step, as shown in FIG. 20, contact layers 31 such as Ni/Au layers are formed on by electroless plating on the respective plated layers 16 to serve as Cu electrodes. In Ni electroless plating and Au electroless plating, the same processes are performed as those in the step of forming the Ni/Au layers 21 according to the sixth embodiment.

Figure 21:
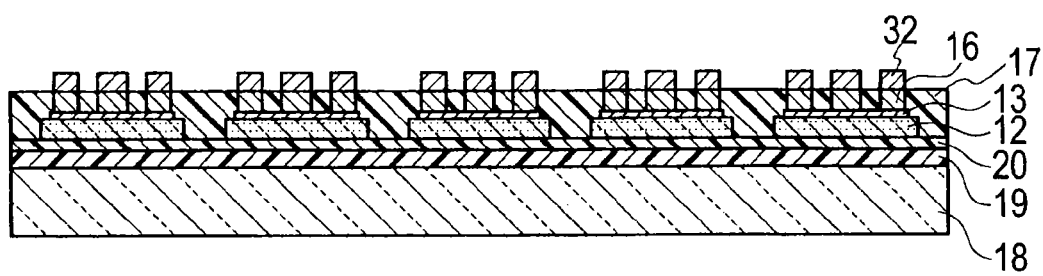
FIG. 21 is a second process cross-sectional view.

Then, as shown in FIG. 21, a solder paste 32 made of Sn-3.0Ag-0.5Cu is applied onto the contact layers 31 by printing. Note that the method for applying the solder paste 32 is not limited to printing.

Figure 22:
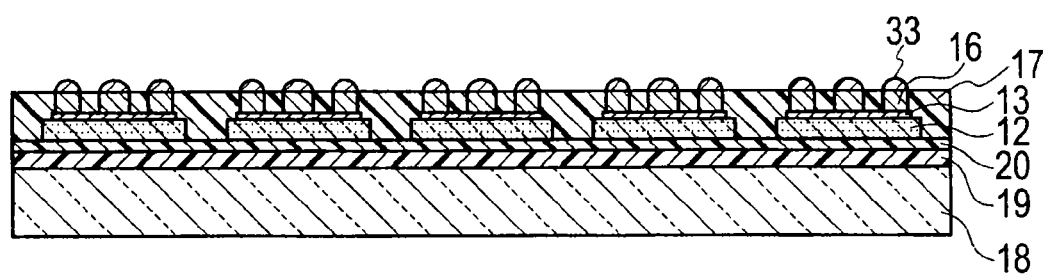
FIG. 22 is a third process cross-sectional view.

Then, as shown in FIG. 22, the light-transmissive substrate 18, which is a wafer, is passed through a reflow furnace. As a result, the solder is remelted and a flux residue is cleaned off. Thereby, solder bumps 33 are formed on the respective plated layers 16 to serve as Cu electrodes. In this way, the metal layers 11a and 11b of the optical semiconductor device 1B are formed.

Figure 23:
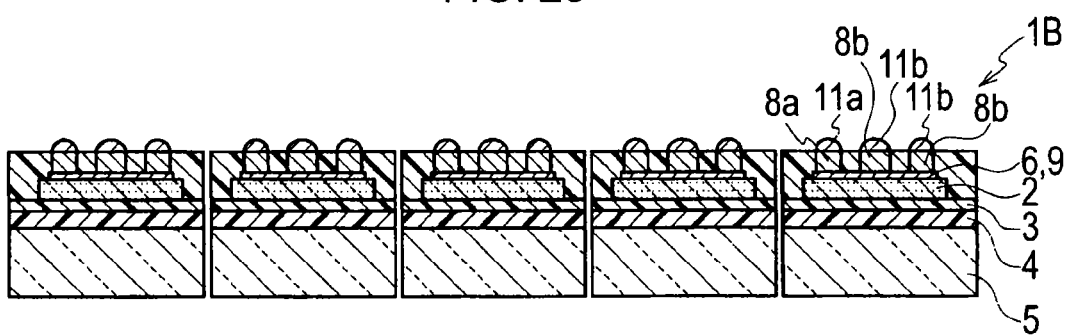
FIG. 23 is a fourth process cross-sectional view.

Lastly, as shown in FIG. 23, the resultant stack is diced into the multiple optical semiconductor devices 1B using a dicer. In this way, the optical semiconductor device 1B according to the second embodiment is obtained.

As described above, according to the seventh embodiment of the present invention, the optical semiconductor device 1B according to the second embodiment can be manufactured. Thus, the seventh embodiment can provide the same effects as the second embodiment. Moreover, the seventh embodiment allows a large number of optical semiconductor devices 1B to be manufactured through a single manufacturing process, and thus allows mass production of the optical semiconductor devices 1B. Therefore, the seventh embodiment can suppress the costs of the optical semiconductor devices 1B.

Eighth Embodiment

With reference to FIGS. 24 to 27, an eighth embodiment of the present invention will be described. In the eighth embodiment of the present invention, a method for manufacturing the optical semiconductor device 1D according to the fourth embodiment will be described. Note that this manufacturing method can be used as a method for manufacturing the optical semiconductor device 1E according to the fifth embodiment. In the eighth embodiment, the same parts as those in the fourth embodiment are denoted by the same reference numerals, and the description thereof is omitted.

The manufacturing process according to the eighth embodiment of the present invention has the same steps as those in the sixth embodiment from the step of forming the light-emitting layers 12 shown in FIG. 8 to the liftoff step shown in FIG. 16.

Figure 24:
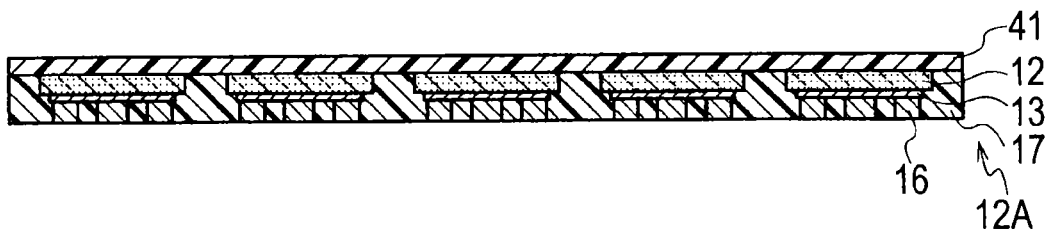
FIG. 24 is a first process cross-sectional view for illustrating a manufacturing method according to an eighth embodiment of the present invention.

After the liftoff step, as shown in FIG. 24, a fluorescent layer 41 is formed on the surface, at which the light-emitting layers 12 are exposed, of the light-emitting substrate 12A, by using a sputtering apparatus. In this way, the fluorescent layer 4 of the optical semiconductor device 1D is formed. Alternatively, the fluorescent layer may be formed to have a multi-layer structure by performing sputtering multiple times. In this case, the fluorescent layer 4 of the optical semiconductor device 1E according to the fifth embodiment can be formed. Note that the fluorescent layer 41 may alternatively be formed using a CVD apparatus.

Figure 25:
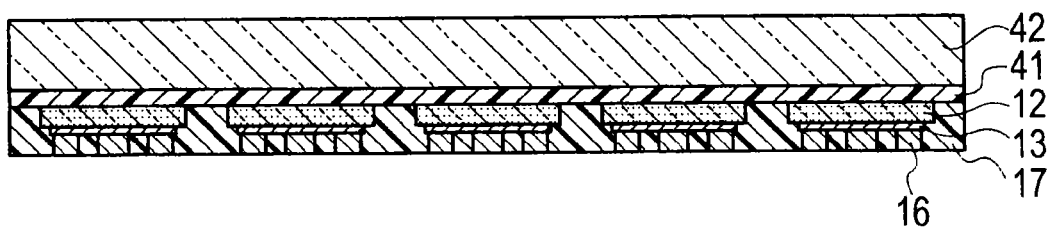
FIG. 25 is a second process cross-sectional view.

Then, as shown in FIG. 25, a liquid glass is applied onto the fluorescent layer 41 by spin coating, and then hardened. Thereby, a light-transmissive layer 42 is formed on the fluorescent layer 41. In this way, the light-transmissive layer 5 of the optical semiconductor device 1D is formed. Besides spin coating, the method for applying the liquid glass may be spraying, and does not particularly limited. The glass layer can be hardened by being heated at 200° C. for an hour, for example. Besides a liquid glass, any material may be used for the light-transmissive layer 42 according to need.

Figure 26:
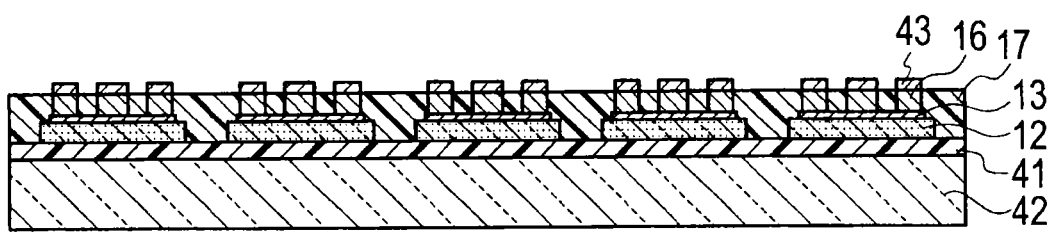
FIG. 26 is a third process cross-sectional view.

Then, as shown in FIG. 26, Ni/Au layers 43 are formed on by electroless plating on the respective plated layers to serve as Cu electrodes. In this way, the metal layers 11a and 11b of the optical semiconductor device 1D are formed. In Ni electroless plating and Au electroless plating, the same processes are performed as those in the step of forming the Ni/Au layers 21 according to the sixth embodiment.

Figure 27:
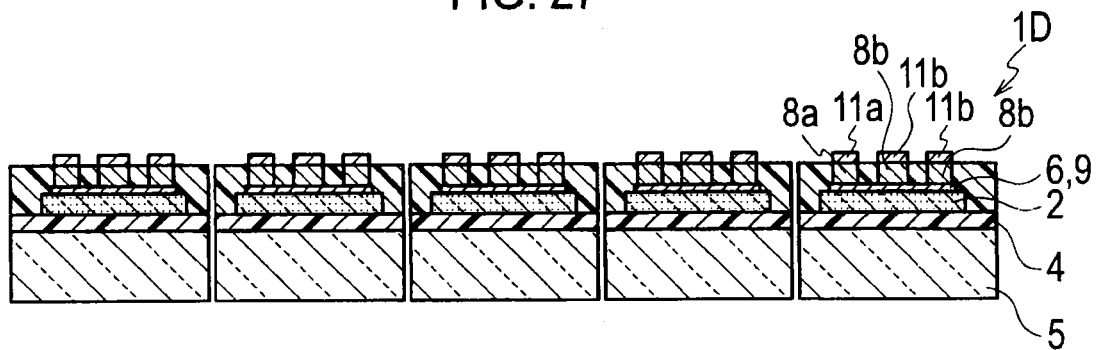
FIG. 27 is a fourth process cross-sectional view.

Lastly, as shown in FIG. 27, the resultant stack is diced into the multiple optical semiconductor devices 1D using a dicer. In this way, the optical semiconductor device 1D according to the fourth embodiment is obtained. Note that approximately the same steps as above are employed in the manufacturing process of the optical semiconductor device 1E according to the fifth embodiment. By performing sputtering multiple times in the step of forming the fluorescent layer 41 to cause the fluorescent layer 41 to have a multi-layer structure, the optical semiconductor device 1E according to the fifth embodiment can be obtained.

As described above, according to the eighth embodiment of the present invention, the optical semiconductor device 1D according to the fourth embodiment can be manufactured. Thus, the eighth embodiment can provide the same effects as the fourth embodiment. In addition, by causing the fluorescent layer 41 to have a multi-layer structure, the optical semiconductor device 1E according to the fifth embodiment can be manufactured. Thus, the eighth embodiment can provide the same effects as the fifth embodiment. Moreover, the sixth embodiment allows a large number of optical semiconductor devices 1D or 1E to be manufactured through a single manufacturing process, and thus allows mass production of the optical semiconductor devices 1D or 1E. Therefore, the eighth embodiment can suppress the costs of the optical semiconductor devices 1D and 1E.

Other Embodiments

Note that the present invention is not limited to the foregoing embodiments, and may be variously changed without departing from the gist of the present invention. For example, some of the components shown in the foregoing embodiments may be omitted. In addition, the components in different ones of the embodiments may be used in combination according to need. Moreover, specific values used in the foregoing embodiments are only examples, and thus the present invention is not limited to these.

What is claimed is:

1. A method for manufacturing an optical semiconductor device, comprising:
    forming a plurality of light-emitting layers on a substrate;
    forming a plurality of conductive portions on each of the light-emitting layers, the plurality of conductive portions being used to cause a current for exciting the light-emitting layers to flow through the light-emitting layers;
    providing a sealing material between the plurality of conductive portions to form a sealing layer;
    removing the substrate while supporting the light-emitting layers by a support body which includes the conductive portions and the sealing layer; and
    forming a fluorescent layer containing phosphor particles on a side of a surface of the light-emitting layers, which is opposite to a surface on which the conductive portions are formed after removing the substrate.

2. The method for manufacturing an optical semiconductor device according to claim 1, wherein
    the plurality of the conductive portions include one of a positive electrode and a negative electrode, and
    the method further comprises separating the light-emitting layers after removing the substrate, each separated light-emitting layer having at least one of the positive electrode and the negative electrode.

3. The method for manufacturing an optical semiconductor device according to claim 1, further comprising:
    separating the light-emitting layers by cutting between adjacent ones of the light-emitting layers after removing the substrate.

4. The method for manufacturing an optical semiconductor device according to claim 3, wherein the cutting comprises using a dicer between adjacent ones of the light-emitting layers.

5. The method for manufacturing an optical semiconductor device according to claim 1, further comprising:
    forming a resultant stack including the light-emitting layers; and
    separating the resultant stack into pieces after removing the substrate, each of the pieces including at least one of the light-emitting layers.

6. The method for manufacturing an optical semiconductor device according to claim 1, wherein forming the sealing layer comprises filling a gap between adjacent ones of the light-emitting layers.

7. The method for manufacturing an optical semiconductor device according to claim 1, further comprising:
    forming a light-transmissive layer on a side of a surface of the light-emitting layers, which is opposite to a surface on which the conductive portions are formed after removing the substrate, the light-transmissive layer transmitting light from the light-emitting layers.

8. The method for manufacturing an optical semiconductor device according to claim 7, wherein the light-transmissive layer has a wider width than a width of the light-emitting layers.

9. The method for manufacturing an optical semiconductor device according to claim 7, comprising forming the light-transmissive layer to cover a gap between adjacent ones of the light-emitting layers.

10. A method for manufacturing an optical semiconductor device, comprising:
    forming a plurality of light-emitting layers on a substrate;
    forming a plurality of conductive portions on each of the light-emitting layers, the plurality of conductive portions being used to cause a current for exciting the light-emitting layers to flow through the light-emitting layers;
    providing a sealing material between the plurality of conductive portions to form a sealing layer;
    removing the substrate while supporting the light-emitting layers by a support body which includes the conductive portions and the sealing layer;
    separating the light-emitting layers by cutting between adjacent ones of the light-emitting layers after removing the substrate; and forming a light-transmissive layer on a side of a surface of the light-emitting layers, which is opposite to a surface on which the conductive portions formed after removing the substrate and before separating the light-emitting layers, the light-transmissive layer transmitting light from the light-emitting layers.

11. The method for manufacturing an optical semiconductor device according to claim 10, comprising forming the light-transmissive layer to cover a gap between adjacent ones of the light-emitting layers.

12. The method for manufacturing an optical semiconductor device according to claim 11, wherein a side surface of the light-transmissive layer is flush with a side surface of the sealing layer after separating the light emitting layers.

13. The method for manufacturing an optical semiconductor device according to claim 11, wherein the light-transmissive layer and the sealing layer are cut collectively in separating the light-emitting layers.

14. The method for manufacturing an optical semiconductor device according to claim 1, wherein the fluorescent layer has a wider width than a width of the light-emitting layers.

15. The method for manufacturing an optical semiconductor device according to claim 1, comprising forming the fluorescent layer to cover a gap between adjacent ones of the light-emitting layers.

16. The method for manufacturing an optical semiconductor device according to claim 1, wherein a thickness of the fluorescent layer is smaller than a thickness of the sealing layer.

17. A method for manufacturing an optical semiconductor device, comprising:
    forming a plurality of light-emitting layers on a substrate;
    forming a plurality of conductive portions on each of the light-emitting layers, the plurality of conductive portions being used to cause a current for exciting the light-emitting layers to flow through the light-emitting layers;
    providing a sealing material between the plurality of conductive portions to form a sealing layer;
    removing the substrate while supporting the light-emitting layers by a support body which includes the conductive portions and the sealing layer;
    separating the light-emitting layers by cutting between adjacent ones of the light-emitting layers after removing the substrate; and
    forming a fluorescent layer containing phosphor particles on a side of a surface of the light-emitting layers, which is opposite to a surface on which the conductive portions are formed.

18. The method for manufacturing an optical semiconductor device according to claim 17, comprising forming the fluorescent layer to cover a gap between adjacent ones of the light-emitting layers.

19. The method for manufacturing an optical semiconductor device according to claim 18, wherein a side surface of the fluorescent layer is flush with a side surface of the sealing layer after separating the light emitting layers.

20. The method for manufacturing an optical semiconductor device according to claim 18, wherein separating the light-emitting layers comprises collectively cutting the fluorescent layer and the sealing layer.

21. The method for manufacturing an optical semiconductor device according to claim 18, wherein separating the light-emitting layers comprises collectively cutting at least a portion of the fluorescent layer and at least a portion of the sealing layer.

22. The method for manufacturing an optical semiconductor device according to claim 1, comprising forming the conductive portions from metal.

23. The method for manufacturing an optical semiconductor device according to claim 1, wherein each of the conductive portions includes at least one of an electrode, a rewiring layer, and a pillar.

24. The method for manufacturing an optical semiconductor device according to claim 1, wherein the sealing material includes resin.

25. The method for manufacturing an optical semiconductor device according to claim 1, wherein the sealing material includes thermosetting resin.

26. The method for manufacturing an optical semiconductor device according to claim 1, comprising forming the sealing layer to continuously seal the plurality of light-emitting layers and the plurality of conductive portions.

27. The method for manufacturing an optical semiconductor device according to claim 1, comprising forming the sealing layer to cover the plurality of light-emitting layers and the plurality of conductive portions.

28. The method for manufacturing an optical semiconductor device according to claim 1, further comprising:
    exposing end faces of the conductive portions from the sealing layer.

29. The method for manufacturing an optical semiconductor device according to claim 28, further comprising:
    forming a metal layer on the exposed end faces.

30. A method for manufacturing an optical semiconductor device, comprising:
    forming a light-emitting layer on a substrate;
    forming a plurality of conductive portions on the light-emitting layer, the plurality of conductive portions being used to cause a current for exciting the light-emitting layer to flow through the light-emitting layer;
    providing a sealing material between the plurality of conductive portions to form a sealing layer;
    removing the substrate while supporting the light-emitting layer by a support body which includes the conductive portions and the sealing layer; and
    forming a fluorescent layer containing phosphor particles on a side of a surface of the light-emitting layer, which is opposite to a surface on which the conductive portions are formed after removing the substrate.

31. A method for manufacturing an optical semiconductor device, comprising:
    forming a stacked structure, the stacked structure including a substrate, a light-emitting layer provided on the substrate, a plurality of conductive portions on the light-emitting layer, and a sealing layer provided between the conductive portions, the plurality of conductive portions being used to cause a current for exciting the light-emitting layer to flow through the light-emitting layer;
    removing the substrate while supporting the light-emitting layer by a support body which includes the conductive portions and the sealing layer; and
    forming a fluorescent layer containing phosphor particles on a side of a surface of the light-emitting layer, which is opposite to a surface on which the conductive portions are formed after removing the substrate.

32. The method for manufacturing an optical semiconductor device according to claim 30, further comprising:
    forming a light-transmissive layer on a side of a surface of the light-emitting layers, which is opposite to a surface on which the conductive portions are formed after removing the substrate, the light-transmissive layer transmitting light from the light-emitting layers.

33. The method for manufacturing an optical semiconductor device according to claim 32, wherein the light-transmissive layer has a wider width than a width of the light-emitting layers.

34. The method for manufacturing an optical semiconductor device according to claim 30, wherein the fluorescent layer has a wider width than a width of the light-emitting layers.

35. The method for manufacturing an optical semiconductor device according to claim 30, comprising:
   forming a plurality of light-emitting layers on the substrate;
   forming a plurality of the conductive portions on each of the light-emitting layers; and
   removing the substrate while supporting the light-emitting layers by the support body.

36. The method for manufacturing an optical semiconductor device according to claim 31, further comprising:
   forming a light-transmissive layer on a side of a surface of the light-emitting layers, which is opposite to a surface on which the conductive portions are formed after removing the substrate, the light-transmissive layer transmitting light from the light-emitting layers.

37. The method for manufacturing an optical semiconductor device according to claim 36, wherein the light-transmissive layer has a wider width than a width of the light-emitting layers.

38. The method for manufacturing an optical semiconductor device according to claim 31, wherein the fluorescent layer has a wider width than a width of the light-emitting layers.

* * * * *